(12) United States Patent
Liu et al.

(10) Patent No.: US 8,018,728 B2
(45) Date of Patent: Sep. 13, 2011

(54) PATCH PANEL

(75) Inventors: Hsing-Chang Liu, Taipei Hsien (TW); Han-Chieh Chang, Taipei Hsien (TW)

(73) Assignees: Foxnum Technology Co., Ltd., Tu-Cheng, New Taipei (TW); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 919 days.

(21) Appl. No.: 11/954,238

(22) Filed: Dec. 12, 2007

(65) Prior Publication Data

US 2009/0141466 A1     Jun. 4, 2009

(30) Foreign Application Priority Data

Dec. 4, 2007    (CN) .......................... 2007 1 0202840

(51) Int. Cl.
  *H05K 7/02* (2006.01)
  *H05K 7/06* (2006.01)
  *H05K 7/08* (2006.01)
  *H05K 7/10* (2006.01)
(52) U.S. Cl. .......................... 361/760; 361/782; 361/784

(58) Field of Classification Search .......... 361/782–784; 398/51
See application file for complete search history.

(56) References Cited

U.S. PATENT DOCUMENTS

| 4,873,681 A * | 10/1989 | Arthurs et al. ................. 398/51 |
| 5,777,762 A * | 7/1998 | Yamamoto ..................... 398/51 |
| 6,647,010 B1 * | 11/2003 | Ford et al. ..................... 370/391 |

FOREIGN PATENT DOCUMENTS

| CN | 1353560 A | 6/2002 |
| EP | 00403143 A2 | 5/2002 |

* cited by examiner

*Primary Examiner* — Tuan T Dinh
(74) *Attorney, Agent, or Firm* — Altis Law Group, Inc.

(57) ABSTRACT

An exemplary patch panel includes a printed circuit board having a plurality of input terminals and output terminals. An amount of the input terminals is equal to an amount of the output terminals. The input terminals are connected to the output terminals respectively. The printed circuit board further includes a plurality of standby terminals. Each of the input terminals is connected to the standby terminals via switches respectively. The standby terminals can be used to selectively replace a number of the input terminals or the output terminals, should they become inoperable, by operating the switches.

3 Claims, 1 Drawing Sheet

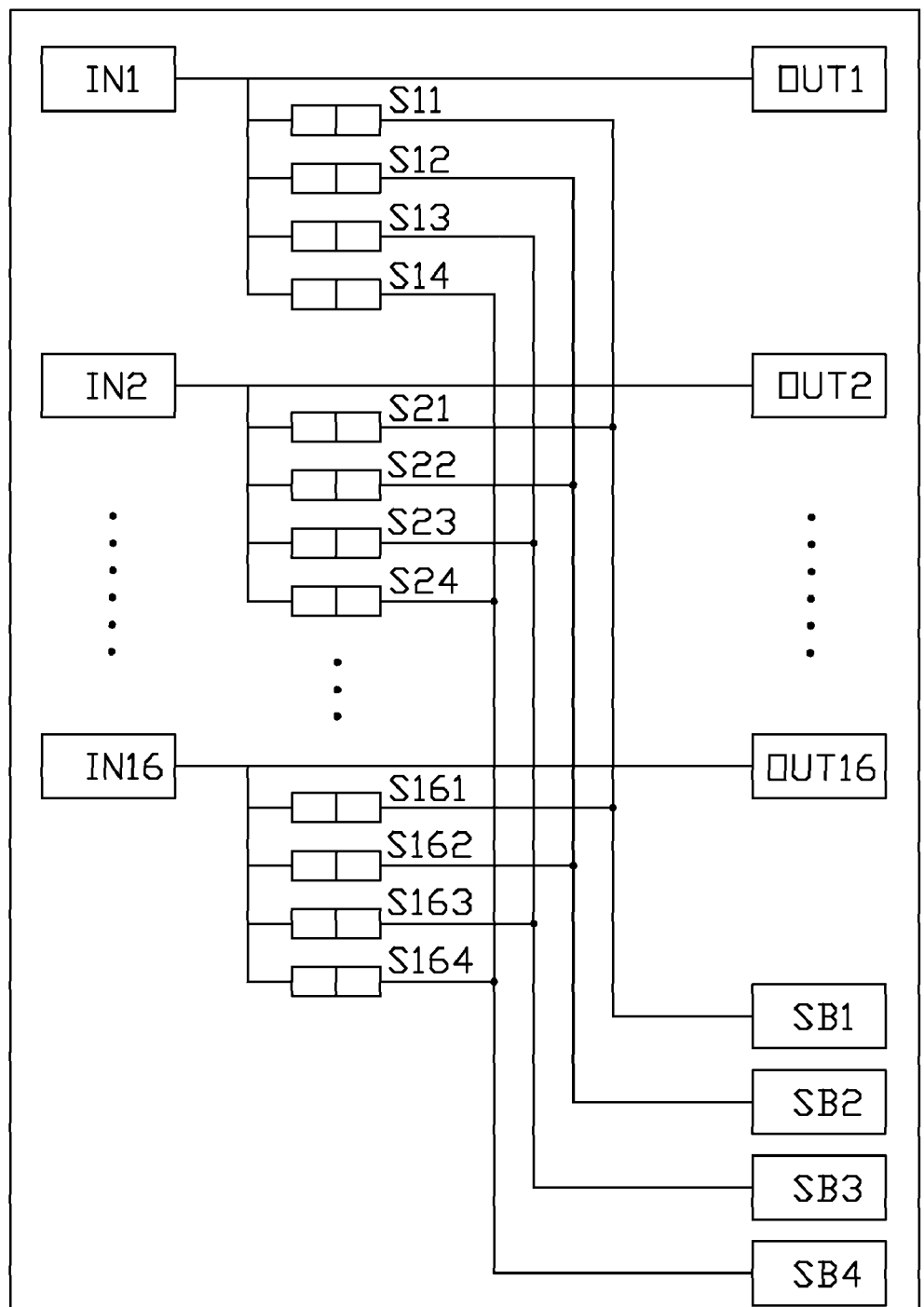

PATCH PANEL

CROSS-REFERENCES TO RELATED APPLICATION

Relevant subject matter is disclosed in a co-pending U.S. patent application Ser. No. 11/954,237 filed on the same date and entitled "ADAPTER", which is assigned to the same assignee as this patent application.

BACKGROUND

1. Field of the Invention

The present invention relates to a patch panel.

2. Description of Related Art

Conventionally, operators use an adapter or a patch panel to couple an electric device to another electric device for signal transmission therebetween. If one of the input or output terminals (which are arranged to connect to the devices) of the patch panel becomes inoperable, the signal transmission will be stopped.

What is needed is a patch panel with standby terminals to maintain signal transmission when one or more of the terminals connected to the devices become inoperable.

SUMMARY

An exemplary patch panel includes a printed circuit board having a plurality of input terminals and output terminals. An amount of the input terminals is equal to an amount of the output terminals. The input terminals are connected to the output terminals respectively. The printed circuit board further includes a plurality of standby terminals. Each of the input terminals is connected to the standby terminals via switches respectively. The standby terminals replace the input terminals or the output terminals by operating the switches when one or more of the input terminals or output terminals becomes inoperable.

Other advantages and novel features of the present invention will become more apparent from the following detailed description of preferred embodiment when taken in conjunction with the accompanying drawing, in which:

BRIEF DESCRIPTION OF THE DRAWINGS

The drawing is a circuit diagram of a patch panel in accordance with an embodiment of the present invention.

DETAILED DESCRIPTION

Referring to the drawing, a patch panel in accordance with an embodiment of the present invention includes a printed circuit board 10 having sixteen input terminals IN1~IN16, sixteen output terminals OUT1~OUT16, and four standby terminals SB1~SB4. The input terminals IN1~IN16 are connected to the output terminals OUT1~OUT16 respectively. The input terminal IN1 is connected to the standby terminals SB1~SB4 via four switches S11~S14 respectively. The input terminal IN2 is connected to the standby terminals SB1~SB4 via four switches S21~S24 respectively. The input terminal IN16 is connected to the standby terminals SB1~SB4 via four switches S161~S164 respectively. And the other input terminals IN3~N15 are connected to the standby terminals SB1~SB4 via switches having a same connection to the input terminals IN1, IN2, and IN16.

Therefore, the standby terminals SB1~SB4 can replace a number of the input terminals IN1~IN16 or the output terminals OUT1~OUT16 if they become inoperable by operating the switches. For example, if the input terminal IN1 becomes inoperable, a user can select one of the standby terminals SB1~SB4 by operating the switches S11~S14 to replace the input terminal IN1.

In this embodiment of the invention, the amount of the input terminals is sixteen, and the amount of the output terminals is sixteen The amount of the standby terminals is four. The amount of the input terminals, output terminals, or standby terminals is not limited. The switches are jumpers or any other types of switches.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A patch panel comprising a printed circuit board having a plurality of input terminals, a plurality of output terminals, and a plurality of standby terminals, wherein the number of the input terminals is equal to the number of the output terminals, the input terminals are connected to the output terminals respectively, each of the input terminals is connected to the standby terminals via switches respectively, the standby terminals are used to selectively replace one or more of the input terminals and the output terminals upon a condition that the one or more of the input terminals and the output terminals become inoperable, by operating the switches.

2. The patch panel as claimed in claim 1, wherein the number of the input terminals is sixteen, the number of the output terminals is sixteen, and the number of the standby terminals is four.

3. The patch panel as claimed in claim 1, wherein the switches are jumpers.

* * * * *